United States Patent
Bach et al.

(10) Patent No.: US 6,493,851 B1
(45) Date of Patent: Dec. 10, 2002

(54) METHOD AND APPARATUS FOR INDENTIFYING CAUSES OF POOR SILICON-TO-SIMULATION CORRELATION

(75) Inventors: Randall E. Bach, Stillwater, MN (US); Robert W. Davis, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 83 days.

(21) Appl. No.: 09/848,489

(22) Filed: May 3, 2001

(51) Int. Cl.[7] ............................................. G06F 17/50
(52) U.S. Cl. ............................................. 716/4; 716/6
(58) Field of Search ..................... 716/4, 6, 18; 703/3, 703/4, 14, 19

(56) References Cited

U.S. PATENT DOCUMENTS 6,216,099 B1 * 4/2001 Fang et al. .................... 703/15
6,216,256 B1 * 4/2001 Inoue et al. .................... 716/6

* cited by examiner

*Primary Examiner*—Tom Thomas
*Assistant Examiner*—Douglas W. Owens
(74) *Attorney, Agent, or Firm*—Westman, Champlin & Kelly

(57) ABSTRACT

A method identifies the cause of poor correlation between an integrated circuit model and measured integrated circuit performance. The method includes determining the propagation delays through two separate integrated circuit components. The propagation delays are then compared to each other to identify the cause of the poor correlation.

23 Claims, 7 Drawing Sheets

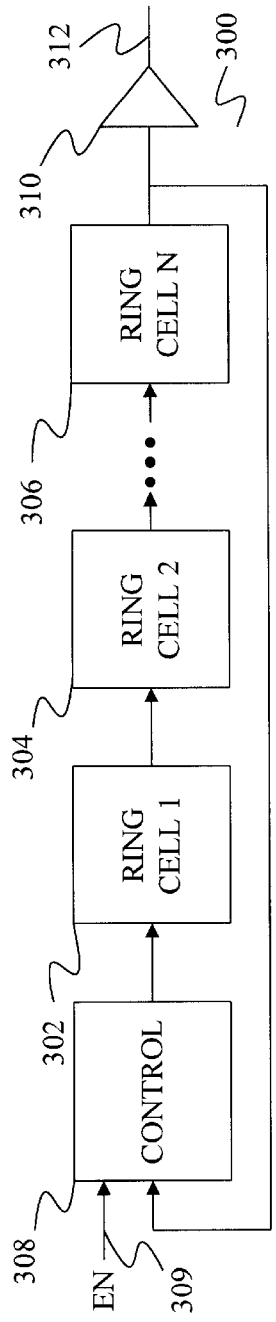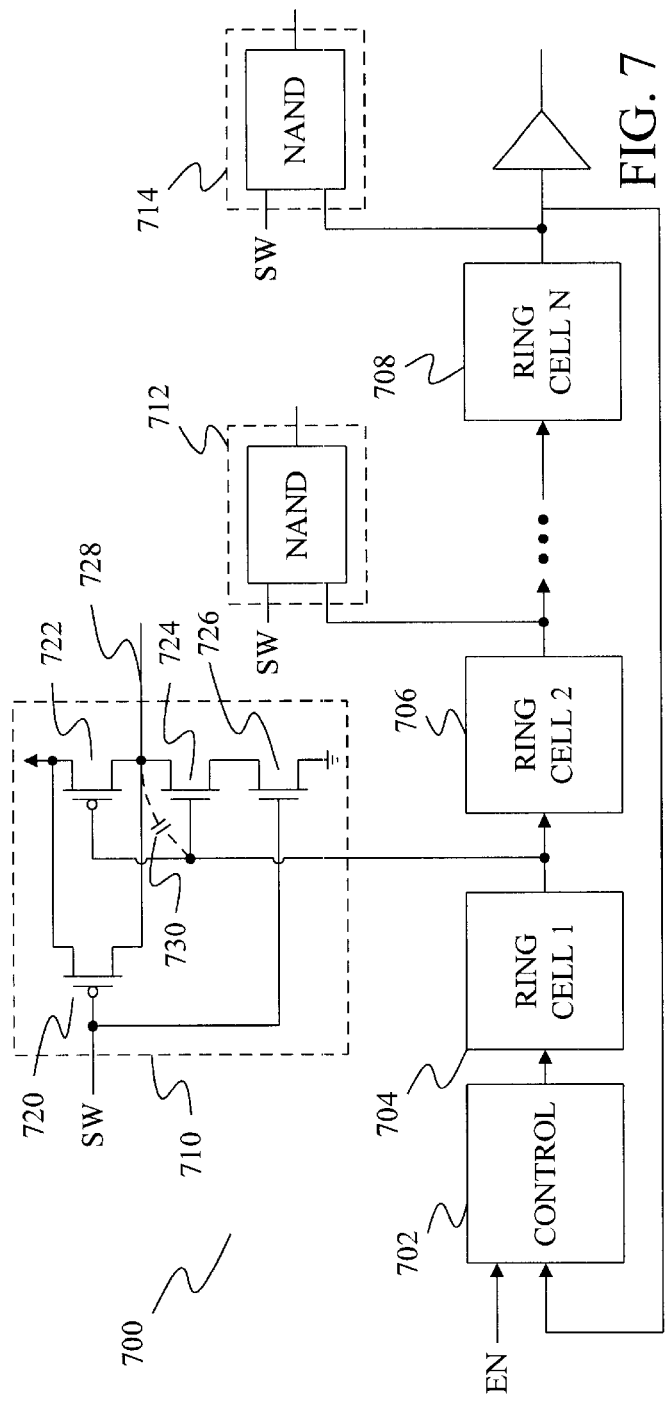

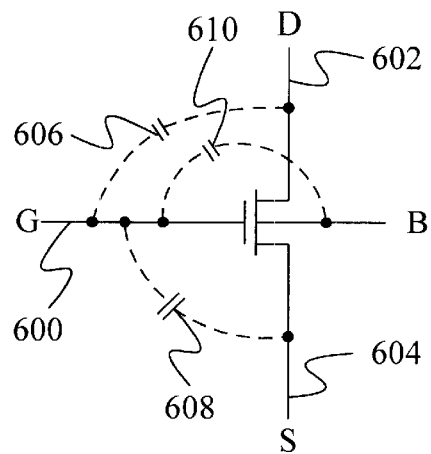
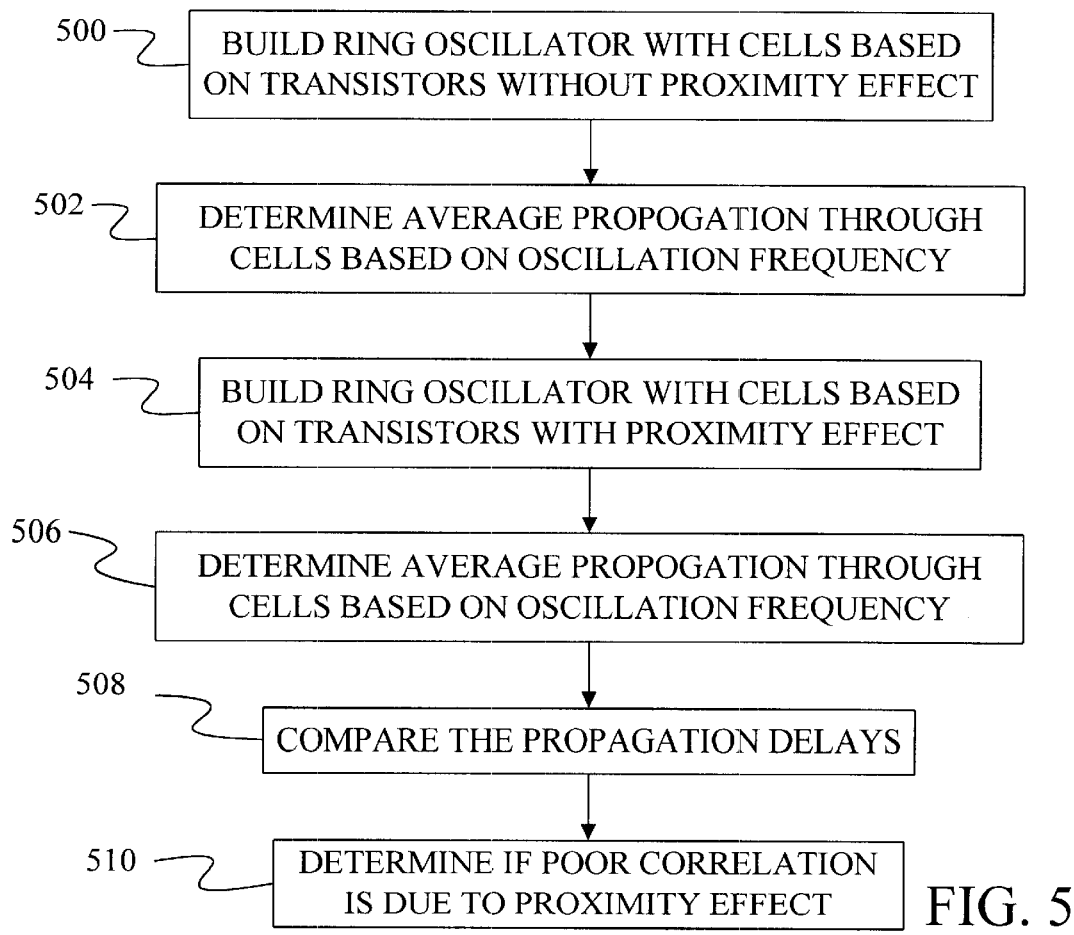
FIG. 6
FIG. 5

METHOD AND APPARATUS FOR INDENTIFYING CAUSES OF POOR SILICON-TO-SIMULATION CORRELATION

BACKGROUND OF THE INVENTION

The present invention relates to simulation tools for predicting the performance of integrated circuit components. In particular, the present invention relates to improving the correlation between the predicted performance for the components and the measured performance for the components.

Integrated circuits are produced by sequentially depositing layers of material on a substrate. Before an integrated circuit can be produced, a large number of masks must be designed that will define the locations for the various material layers. The design and production of these masks represents a significant fixed cost in the production of integrated circuits. As such, it is desirable to ensure that the integrated circuit will operate properly before the masks are produced.

This is typically done by simulating the performance of the individual components of the integrated circuit using a collection of modeling tools. These modeling tools include transistor models, which are used in transistor level simulators, such as HSPICE. They also include cell level models that describe the performance of basic building blocks of logic called standard cells. In particular, the cell models provide timing models describe the propagation delay through the standard cell. During simulations, the propagation delays through the various cells are taken into consideration when performing chip-level timing analysis.

As device sizes become smaller and the speed of devices increase, even small errors in the simulation models significantly reduce the correlation between the performance predicted by the simulation model and the actual performance of the circuit. In the worst case, a circuit will appear to operate properly in simulation, but will not operate at all when it is built.

In the past, testing was done to determine if a component performed as predicted. If the testing showed that the component performance met expectations, the model for the component was accepted as being accurate. However, if the component did not perform as expected, the testing indicated that the model was inaccurate. One problem with this testing was that it did not show why the model did not correlate with the built component. In other words, prior art testing did not indicate the cause of poor correlation between the model and the built component.

SUMMARY OF THE INVENTION

A method identifies the cause of poor correlation between an integrated circuit model and measured integrated circuit performance. The method includes determining the propagation delays through two separate integrated circuit components. The propagation delays are then compared to each other to identify the cause of the poor correlation.

BRIEF DESCRIPTION OF THE DRAWINGS

FIG. 3 is a block diagram of a ring oscillator used in performance testing under the present invention.

FIG. 5 is a flow diagram for determining propagation delays while taking the proximity effect into account.

FIG. 6 is a circuit diagram of a single transistor showing parasitic capacitances.

FIG. 7 is a hybrid block/circuit diagram of a ring oscillator used to determine parasitic capacitance under one embodiment of the present invention.

DETAILED DESCRIPTION OF THE PREFERRED EMBODIMENTS

The present invention provides a method for identifying the cause of poor correlation between the predicted performance of transistors and larger integrated circuits and the actual performance of those elements. This is done by quantifying the effects that particular transistor layouts and/or input states of transistor inputs have on the actual performance of a transistor or cell.

For example, some embodiments of the present invention are used to determine whether poor correlation is due to the dimensions of some transistors in the integrated circuit.

Figure 1:
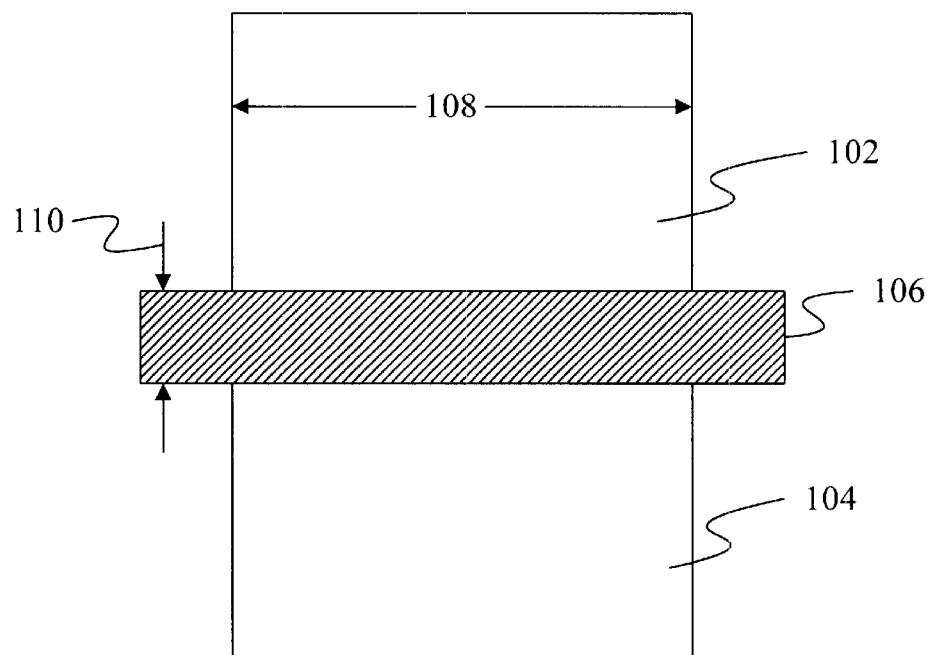
FIG. 1 is a layout of a single transistor on a substrate.

The key dimensions in a transistor are shown in FIG. 1, and include a width 108 of a drain active area 102 and a source active area 104 and a length 110 of a gate or channel 106.

Most transistors in a chip are designed to have the shortest possible channels and are designed to be as wide as possible. As a result, the model parameters for transistors are typically optimized to provide an accurate model for these short channels and wide transistors. The models include additional parameters for extending the optimized model parameters to cover longer channels or narrower transistors. Some of the methods of the present invention determine whether these additional parameters are the cause of poor correlation between the model and the measured performance.

Figure 2:
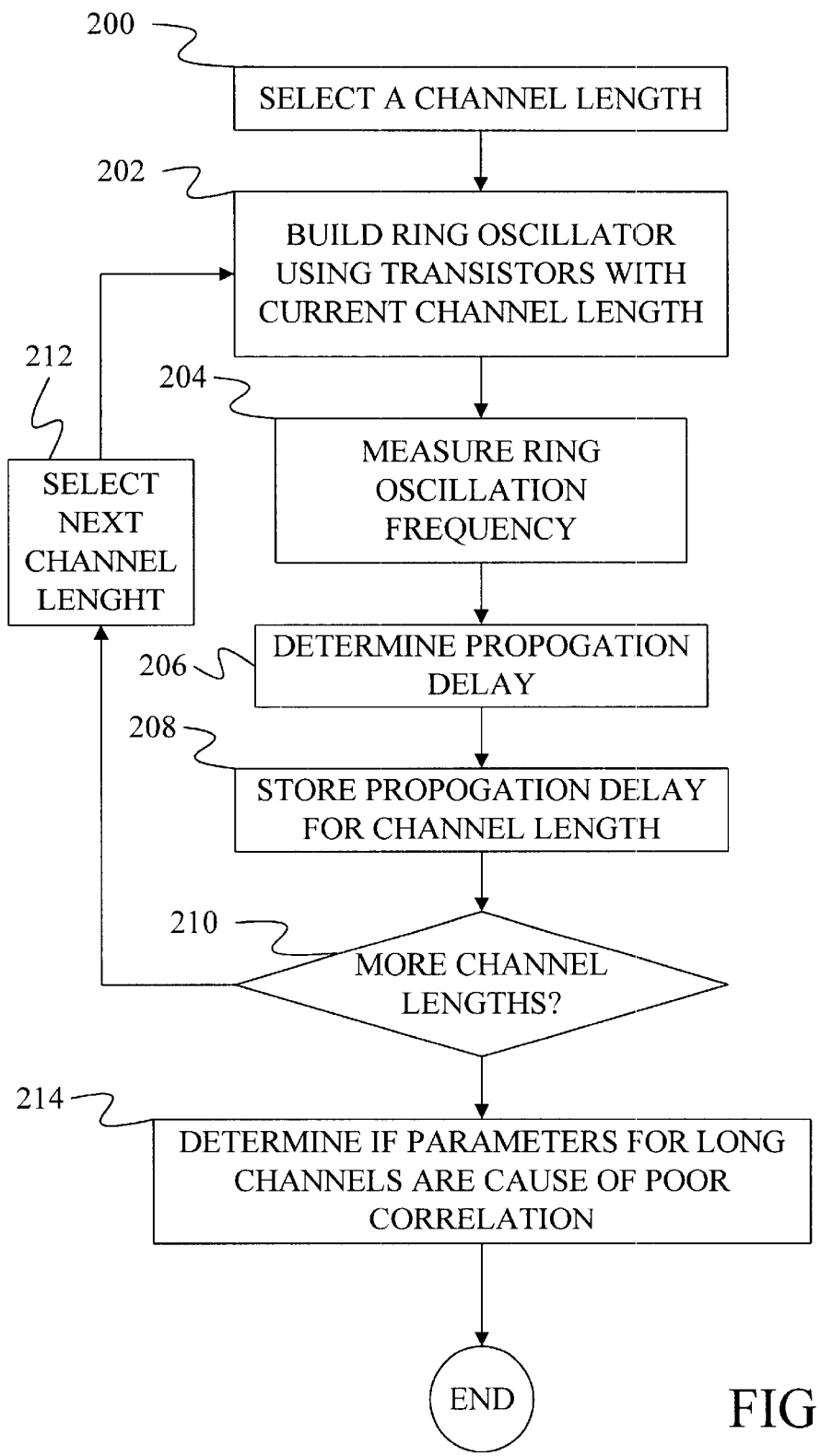
FIG. 2 is a flow diagram of a method for adjusting model parameters based on channel lengths under one embodiment of the present invention.

For instance, the flow diagram of FIG. 2 shows a method for determining if the parameters that describe longer channels are the cause of poor correlation. In step 200 of FIG. 2, the typical channel length is selected. At step 202, a ring oscillator is constructed using transistors that have the selected channel length.

An example of a ring oscillator 300 is shown in FIG. 3. The ring oscillator includes a collection of "n" identical cells such as cells 302, 304 and 306 that are connected together in a ring configuration together with a controller 308. For the purposes of the method of FIG. 2, the cells can include simple devices such as two-input AND gates or two-input NAND gates, where each of the gates is formed with transistors that have a channel of the selected length.

Controller 308 also receives an enable signal 309, which it uses to start and stop oscillations in the ring oscillator. In particular, when enable signal 309 is a "1", controller 308 introduces a pulse into ring 300 that propagates through each of the cells before returning to controller 308. While enable signal 309 remains a "1", controller 308 allows the returned pulse to pass back to the cells, thereby causing the ring to oscillate. However, when enable signal 309 switches to "0", controller 308 prevents the pulse from returning to the cells, thereby stopping the oscillation.

Because the pulse is delayed in each cell when the oscillation ring is oscillating, the oscillation frequency of the ring gives an indication of the propagation delay in each cell. This frequency is measure at an output 310 created by a buffer 312 that is connected to the ring.

In step 204 of FIG. 2, the oscillation frequency of the ring oscillator is measured at output 310. At step 206, this oscillation frequency is used to determine a gate propagation delay, which is stored at step 208 for later use.

At step 209 the process of FIG. 2 determines if there are more channel lengths to be tested. If there are more channel lengths, the next channel length is selected at step 212 and the process returns to step 202 where a new ring oscillator is constructed using transistors that have the newly selected channel length.

When all of the channel lengths have been tested at step 210, the process of FIG. 2 continues at step 214 where the system determines if the parameters used to extend the optimized model parameters to cover longer channels are the cause of poor correlation between the models and the measured performance. In particular, the measured propagation delays are compared to expected delays for the various channel lengths. If the difference between the measured and expected delays is too large, the parameters for the longer channel lengths are identified as a cause of poor correlation.

In other embodiments, instead of testing various channel lengths, various widths are tested. The model parameters are then adjusted so that the model provides timing delays that best fit the timing delays associated with the various channel widths. In still further embodiments, ring oscillators are built for a variety of channel lengths and a variety of channel widths and the model parameters are adjusted to provide a best fit across all of the tested transistor widths and lengths.

Under another aspect of the present invention, a method is provided determining whether poor correlation is caused by transistor channel lengths that differ from their drawn lengths. The lengths of channels can vary from the length designated on the mask due to proximity effects that cause channels drawn close together on the mask to have a smaller finishing length than the length set by the mask.

Figure 4:
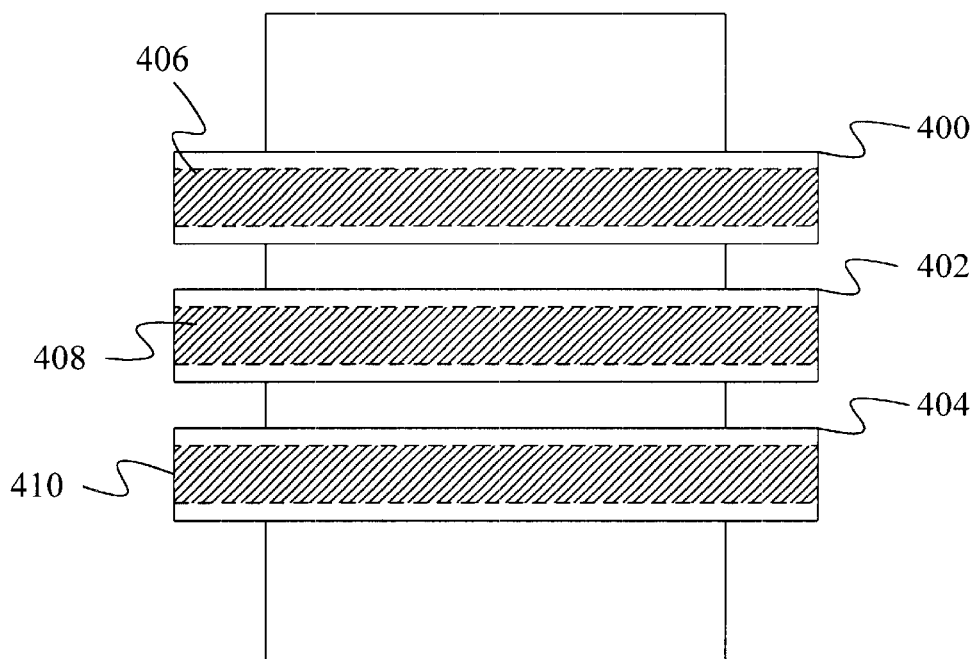
FIG. 4 is a layout of three transistors on a substrate showing the proximity effect.

An example of the proximity effect is shown in FIG. 4 where three channel mask layouts 400, 402 and 404 are shown for three respective transistors. Due to the proximity effect, the final channel sizes do not match mask layouts 400, 402 and 404, but instead finish at a size defined by finishing boxes 406, 408 and 410, respectively. This occurs because the proximity of the transistor poly strips cause the gates to etch at a faster rate, thereby causing the finished length to be smaller.

Prior art modeling tools such as HSPICE do not predict the performance difference between the expected channel length and the realized channel length because such simulators do not have any knowledge of the finished length or the effects the finished length will have on the performance. Therefore, the timing models generated from the HSPICE data will not accurately reflect the performance of transistors suffering from the proximity effect.

FIG. 5 provides a flow diagram of a method under one embodiment of the present invention for determining if the proximity effect is the cause of poor correlation between the models and the measured performance.

In step 500 of FIG. 5, a ring oscillator, such as ring oscillator 300 of FIG. 3, is constructed with cells that include gates which are known to be subject to the proximity effect. In the gates constructed in step 500, the transistors are laid out so as to avoid the proximity effect. Thus, the transistors in the ring oscillator of step 500 have a finished length that matches the layout length.

In step 502 of FIG. 5, the average propagation delay through each cell of the ring oscillator is determined based on the oscillation frequency of the ring oscillator.

At step 504, a second ring oscillator is constructed with the same type of logic gates that are found in the first ring oscillator. Although the gate types are the same, the transistors in the ring oscillator of step 504 are laid out so that they are close enough together to produce the proximity effect. Thus, the channel lengths of the transistors in the ring oscillator of step 504 are shorter than the channel lengths of the transistors of step 500.

At step 506, the average propagation through each of the cells of the ring oscillator of step 504 is determined. This average propagation delay is compared to the average propagation delay determined in step 502 at step 508.

The comparison made at step 508 is used in step 510 to determine if poor correlation between the model and the measured performance is caused by the proximity effect. In particular, if there is a larger than predicted difference between the two propagation delays, the proximity effect is likely one factor that is contributing to poor correlation.

If the proximity effect is one cause of poor correlation, the correlation can be improved in any of a number of ways including changing the channel spacing to reduce the proximity effect, or changing the logic-level timing models of gates that are subject to the proximity effect so that the timing models better predict the behavior of these gates.

A further embodiment of the present invention determines whether loads placed on a transistor are a cause of poor correlation between the measured performance and the models. In particular, this embodiment determines whether the parasitic capacitance of a transistor tied to the output of another transistor is the cause of poor correlation.

FIG. 6 shows a circuit diagram of a MOSFET transistor having a gate 600, a drain 602 and a source 604. The transistor of FIG. 6 includes three input parasitic capacitances 606, 608 and 610. Parasitic capacitance 606 is a gate-to-drain capacitance, parasitic capacitance 608 is a gate-to-source capacitance, and parasitic capacitance 610 is a gate-to-body capacitance.

Figure 8:
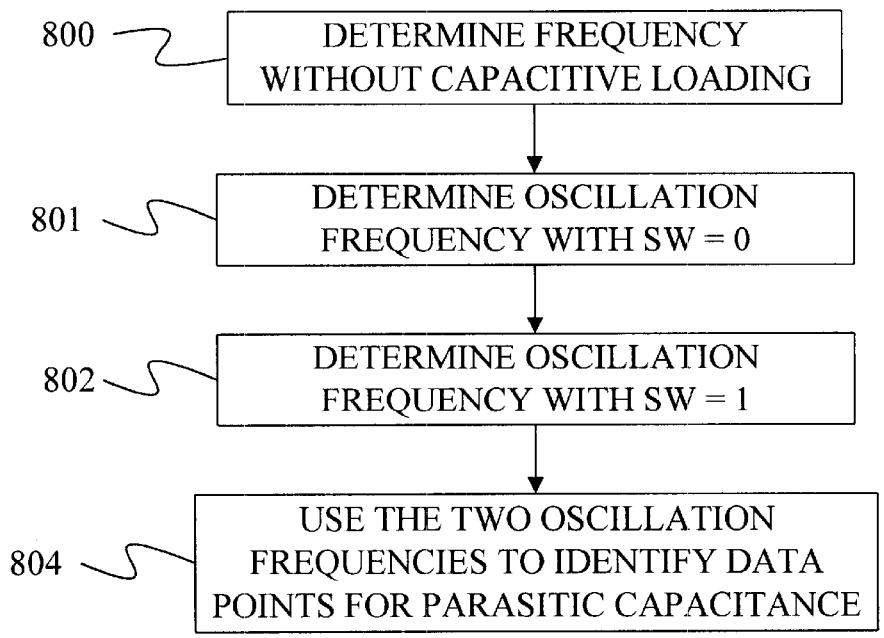
FIG. 8 is a flow diagram for measuring parasitic capacitance under one embodiment of the present invention.

FIGS. 7 and 8 provide a block diagram of a ring oscillator and a flow diagram that are used in the present invention to generate data to determine whether capacitive loading is the cause of poor correlation between the models and the measure performance.

In step 800 of FIG. 8, the frequency of a ring oscillator without any capacitive loading is determined using a ring oscillator such as ring oscillator 300 of FIG. 3. In step 801, the frequency of a ring oscillator with the same type of cells that were used in step 800 is determined with a parasitic capacitance placed as a load on the output of each cell. A ring oscillator for performing this measurement is shown in FIG. 7.

The block diagram of FIG. 7 includes a ring oscillator 700 that has a controller 702, ring cells 704, 706 and 708, and load cells 710, 712 and 714. Ring cells 704, 706 and 708 contain gates that propagate the ring signal and are similar to the cells used in step 800. Load cells 710, 712 and 714 provide a parasitic capacitive load that is in part based on the parasitic capacitance at the input of a transistor in the load. In the embodiment shown in FIG. 7, the load is constructed from a two input NAND gate.

The construction of the NAND gate is shown in the circuit diagram of load cell 710 of FIG. 7. The NAND gate includes two p-channel transistors 720 and 722 and two n-channel transistors 724 and 726. The sources of the p-channel transistors 720 and 722 are tied to the positive power supply and their drains are connected to an output 728. N-channel transistors 724 and 726 are connected in series between output 728 and ground, with the drain of transistor 724 connected to output 728 and the source of transistor 726 connected to ground. The gates of n-channel transistor 726 and p-channel transistor 720 are connected to an input value SW. The gates of p-channel transistor 722 and n-channel transistor 724 are connected to the output of ring cell 704.

In the configuration of FIG. 7, the parasitic capacitance that affects the ring oscillator is parasitic capacitance 730 located between the gate and drain of n-channel transistor 724.

In step 801, SW is at a logic "0" so that output 728 remains high regardless of the value at the output of ring cell 704. With the load cells in this state, ring oscillator 700 is activated and its oscillation frequency is measured. When compared to the frequency of the ring oscillator without the load, this frequency provides a measure of the effect of a parasitic capacitance load. If this effect is different from the predicted effect indicated by the models, then parasitic capacitance may be a cause of poor correlation between the models and the measured performance.

In step 802 of FIG. 8, the capacitive load of FIG. 7 is modified to determine whether a capacitance exhibiting the Miller effect is the cause of poor correlation. The Miller effect occurs when a parasitic capacitance extends between the input and the output of an amplifier with a negative gain. In this position, the parasitic capacitance is amplified so that it exhibits a capacitance that is equal to the nominal parasitic capacitance times one minus the gain of the amplifier.

Step 802 determines the impact of a capacitance exhibiting the Miller effect by causing the parasitic capacitances in the loads of FIG. 7 to exhibit the Miller effect and then measuring the resulting oscillation frequency of oscillator ring 700. To make the parasitic capacitances exhibit the Miller effect, input SW is set to logic "1". This causes output 728 to switch with the output of ring cell 704 so that it maintains the opposite logical state from the output of ring cell 704. Thus, if the output of ring cell 704 is a logic "1", output 728 of load cell 710 is driven toward a logic "0". Similarly, if the output of ring cell 704 is a logic "0", output 728 is driven toward a logic "1".

With the parasitic capacitance of the load cells exhibiting the Miller effect, the oscillation frequency of ring oscillator 700 is again determined. This frequency is then compared to the frequency of the ring oscillator determined at step 801 and the frequency determined at step 800 to determine the impact of the Miller effect at step 804. This impact is compared to a predicted impact to determine if the model of the Miller effect is accurate. If it is not, capacitances exhibiting the Miller effect may be considered causes of poor correlation between the models and the measured performance.

Although the circuit diagram of the NAND gate is only shown in cell 710, those skilled in the art will recognize that the same circuit is present in each of the load cells such as load cells 712 and 714. Thus, each load cell includes a parasitic capacitance that exhibits the Miller Effect when input SW is a logic "1" and that does not exhibit the Miller Effect when input SW is logic "0".

Under a further embodiment of the present invention, an additional technique is provided for determining the cause of poor correlation between gate-level timing models and measured gate-level performance. Under the prior art, gate-level timing models included three propagation delays for the gate: a minimum delay, a maximum delay, and an average delay. The model delays are determined based on models of the underlying transistor structures of the gate.

When verifying the performance of a gate under the prior art, all but one of the inputs to the gate are held in a fixed state while the time it takes for a pulse to propagate from the one non-fixed input to the output is measured. If this time is within the maximum and minimum propagation delays set by the model, the model is said to be correlated to the actual performance. However, if the delay is outside of the range predicted by the model, the model and the measured performance are not well correlated. Although the difference between the model and the measured performance indicates a problem, it does not indicate the cause of the poor correlation.

Under one embodiment of the present invention, a technique is provided for determining if the cause of poor correlation between the gate-level timing model and the measured performance is due to the values at the fixed inputs to the gate. In the prior art, only one set of values was placed on these inputs during testing. This set was selected so that the pulse would propagate through the gate. However, if more than one combination of values would allow for propagation, only one of the combinations was selected under the prior art. For example, if a pulse will propagate from input A to the output when an input B is "1" and when input B is "1", the prior art only collects propagation data for one B state, "0" or "1".

The present invention provides a method of collecting data for multi-input gates by setting the gates to different states and collecting different sets of timing data for each set of states. Using this technique, the present invention can determine if the cause of poor correlation is the values at the inputs to the gate.

Figure 9:
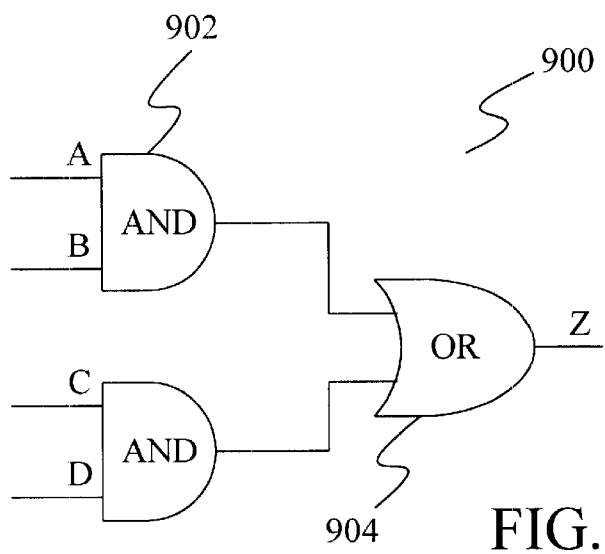
FIG. 9 is a logic diagram of a four-input AND-OR gate.

For example, for a four-input AND-OR gate such as AND-OR gate 900 of FIG. 9, the present invention provides timing data for different combinations of inputs when applying a pulse to input A of gate 900. In particular, the present invention tests each possible combination of input states that allow a pulse to propagate from input A through AND gate 902 and OR gate 904 to output Z. Because input B must be a logic "1" in order for a pulse to propagate through AND gate 902, there are three combinations of inputs that will allow propagation. Those are:

B=1, C=0, D=0;
B=1, C=0, D=1;
B=1, C=1, D=0.

Figure 10:
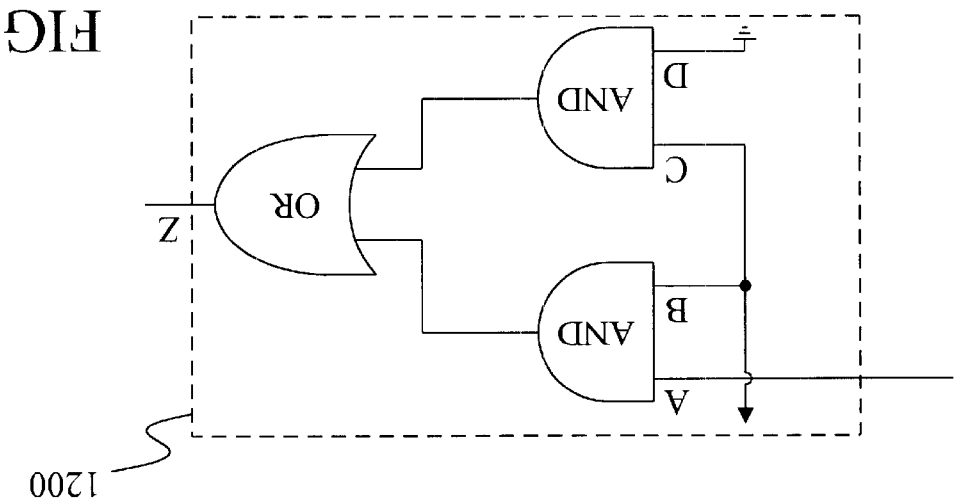
FIG. 10 is a block diagram of one configuration of a four-input AND-OR cell used in ring oscillator testing under one embodiment of the present invention.

The propagation delay for each of these three combinations of input states is measured separately using a ring oscillator, such as the ring oscillator of FIG. 3. Each constructed ring oscillator includes the AND-OR gate of FIG. 9 with its inputs configured for the particular input states being tested. For example, FIG. 10 shows a ring cell 1000 for testing the combination B=1, C=0, and D=0. To test the propagation delay for this set of inputs, cell 1000 would be placed into each of the ring cells of ring oscillator 300 and the propagation delay would be determined from the oscillation frequency of the ring oscillator.

Figure 11:
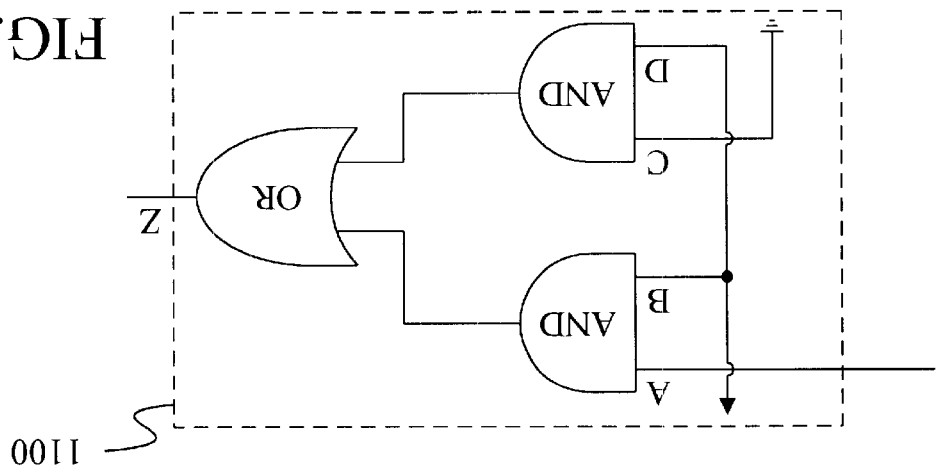
FIG. 11 is a second configuration for a four-input AND-OR cell used in ring oscillator testing under an embodiment of the present invention.
Figure 12:
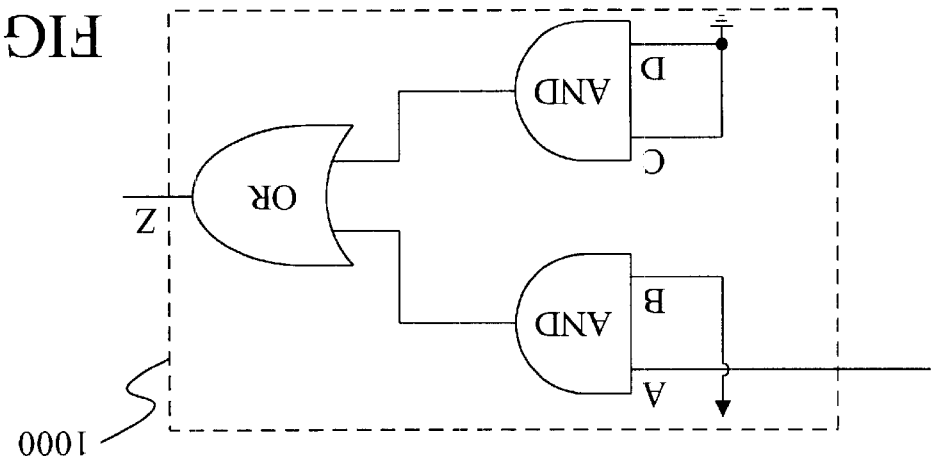
FIG. 12 is a third configuration for a four-input AND-OR cell used in ring oscillator testing under an embodiment of the present invention.

FIG. 11 shows a ring cell 1100 that is used to determine the propagation delay for the input state combination B=1, C=0, and D=1. By placing cell 1100 in each of the cells of ring oscillator 300, the propagation delay for this combination of states can be determined. Similarly, cell 1200 provides a ring oscillator cell for determining a propagation delay for the combination B=1, C=1, and D=0.

The various propagation delays determined for the possible combinations of states are then used to determine whether the correlation error is due to the values at the inputs. To improve the correlation, some embodiments of the invention use the measured delays to set the minimum and maximum delays of the model.

Under a further embodiment of the present invention, a technique is provided for determining whether poor correlation between the model and the measured performance is due to simultaneous switching of gate inputs. Under most gate-level timing models, only one input is assumed to be switching at any one time.

Figure 13:
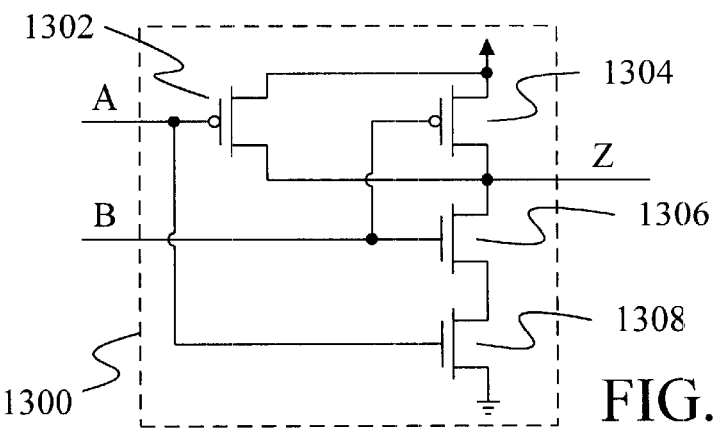
FIG. 13 is a circuit diagram of a NAND gate.

The error introduced by this assumption can be seen from the example of a two input NAND gate, such as NAND gate 1300 of FIG. 13. In FIG. 13, if input B is "1", n-channel transistor 1306 is on and p-channel transistor 1304 is off. If input A is also a logic "1", n-channel transistor 1308 is on and p-channel transistor 1302 is off. As a result, output Z is at ground when inputs A and B are logic ones.

If input B remains at its static value of "1" while input A transitions from "1" to "0", n-channel transistor 1308 will turn off and p-channel transistor 1302 will turn on. This will cause current to flow through p-channel transistor 1302 to output Z until output Z reaches its final voltage. Note that the time needed for output Z to reach its final voltage is a function of the amount of current passing through p-channel transistor 1302.

If on the other hand, input B and input A switch simultaneously from a logical "1" to a logical "0", p-channel transistor 1302 and p-channel transistor 1304 will turn on at the same time. This will cause twice as much current to flow to output Z, thereby raising the voltage at output Z much faster than if input B had remained static. Thus, the propagation delay through NAND gate 1300 is different when input B is static than when input B is switching simultaneously with input A.

To determine the amount of error introduced by the assumption that input B is static, the present invention generates two ring oscillators such as ring oscillator 300 of FIG. 3. In one of the ring oscillators, each of the ring cells contains a NAND gate such as NAND gate 1500 of FIG. 14. In NAND gate 1500, input B is tied to a static value of logic "1" so that p-channel transistor 1502 remains off at all times. The oscillation frequency of the ring oscillator formed from cells 1500 is then determined thereby providing the propagation delay through each cell while input B is static.

Figure 15:
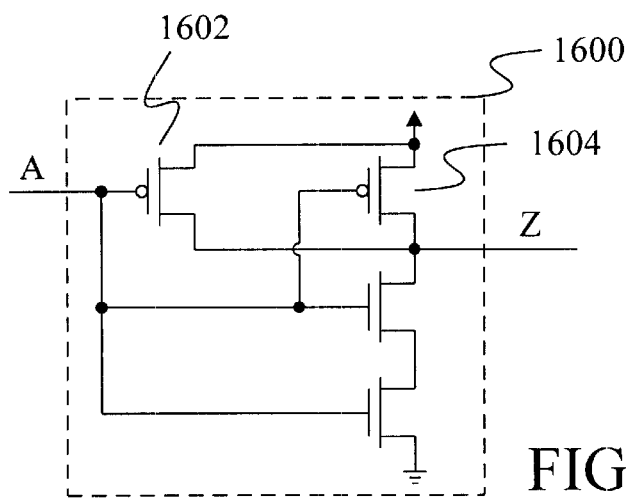
FIG. 15 is a circuit diagram of a NAND cell with two active inputs used in a ring oscillator tester under one embodiment of the present invention.

In the second ring oscillator, each ring cell contains NAND gate 1600 of FIG. 15. In FIG. 15, input A and input B are tied together so that p-channel transistor 1602 and p-channel transistor 1604 switch together. Thus, in cell 1600 there is simultaneous switching. The oscillation frequency for the ring oscillator formed of cells 1600 is then determined to determine the propagation delay when there is simultaneous switching.

The propagation delay for the static input and the propagation delay for the simultaneous switching are then compared to provide an error associated with the assumption that all of the inputs other than the input being tested are static. If this error is too large, the assumption of static inputs may be the cause of poor correlation between the gate-level timing models and the measured performance.

Figure 14:
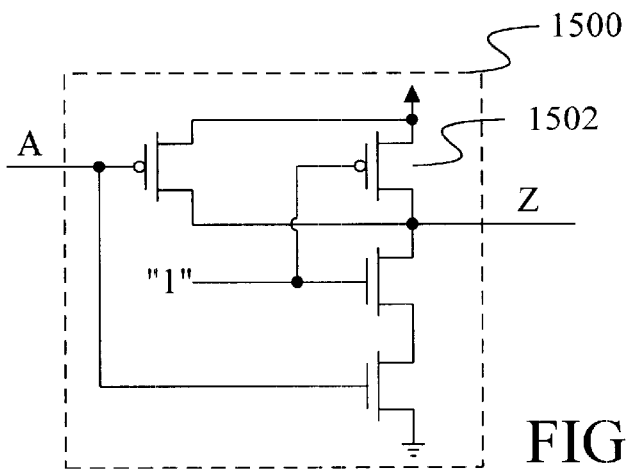
FIG. 14 is a circuit diagram of a NAND cell with one static input used in a ring oscillator tester under one embodiment of the present invention.

Although the embodiment of the invention shown in FIGS. 14 and 15 is a two-input device, those skilled in the art will recognize that gates with larger number of inputs may be tested in the same manner.

Through the various embodiments of the present invention, it is possible to identify one or more causes of poor correlation between a performance predicted by a model and a measured performance. Using this information, the model or the structure of the devices may be modified to improve the correlation.

Although the present invention has been described with reference to preferred embodiments, workers skilled in the art will recognize that changes may be made in form and detail without departing from the spirit and scope of the invention.

What is claimed is:

1. A method for identifying a cause of poor correlation between a performance predicted by a simulation model of an integrated circuit component and a measured performance of the integrated circuit component, the method comprising:
   forming a first ring oscillator to identify a first propagation delay;
   forming a second ring oscillator to identify a second propagation delay;
   comparing the first propagation delay to the second propagation delay; and
   determining whether a factor is a cause of poor correlation between the simulation model and the measured performance based on the comparison of the first propagation delay and the second propagation delay.

2. The method of claim 1 wherein determining whether a factor is a cause of poor correlation comprises determining whether the state of an input on a gate is a cause of poor correlation.

3. The method of claim 2 wherein determining whether the state of an input on a gate is a cause of poor correlation further comprises determining whether a static state of an input on a gate is a cause of poor correlation.

4. The method of claim 3 wherein forming a first ring oscillator comprises forming a first ring oscillator from gates wherein a first input of each of the gates is tied to a first value and wherein forming a second ring oscillator comprises forming a second ring oscillator from gates wherein the first input of each of the gates is tied to a second value different from the first value.

5. The method of claim 2 wherein determining whether the state of an input on a gate is a cause of poor correlation further comprises determining whether a changing state of an input on a gate is a cause of poor correlation.

6. The method of claim 5 wherein forming a first ring oscillator comprises forming a first ring oscillator from gates wherein a first input of each of the gates is tied to a fixed value and wherein forming a second ring oscillator comprises forming a second ring oscillator from gates wherein the first input of each of the gates is tied to a changing value.

7. The method of claim 1 wherein determining whether a factor is a cause of poor correlation comprises determining whether parasitic capacitance is a cause of poor correlation.

8. The method of claim 7 wherein forming a first ring oscillator comprises forming a first ring oscillator comprising cells without parasitic capacitive loads and wherein forming a second ring oscillator comprises forming a second ring oscillator with parasitic capacitive loads.

9. The method of claim 7 wherein determining whether parasitic capacitance is a cause of poor correlation further comprises determining if parasitic capacitance exhibiting the Miller effect is a cause of poor correlation.

10. The method of claim 9 wherein forming a first ring oscillator comprises forming a first ring oscillator comprising cells without parasitic capacitive loads that exhibit the Miller effect and wherein forming a second ring oscillator comprises forming a second ring oscillator with parasitic capacitive loads that exhibit the Miller effect.

11. The method of claim 1 wherein determining whether a factor is a cause of poor correlation comprises determining whether gate lengths are a cause of poor correlation.

12. The method of claim 11 wherein forming a first ring oscillator comprises forming a first ring oscillator from cells comprising transistors having a first gate length and wherein forming a second ring oscillator comprises forming a second ring oscillator from cells comprising transistors having a second gate length.

13. The method of claim 11 wherein determining whether gate lengths are a cause of poor correlation comprises determining if gate lengths produced through a proximity effect are a cause of poor correlation.

14. The method of claim 11 wherein forming a first ring oscillator comprises forming a first ring oscillator from cells comprising transistors having a gate length that is not affected by the proximity effect and wherein forming a second ring oscillator comprises forming a second ring oscillator from cells comprising transistors having a gate length that is affected by the proximity effect.

15. The method of claim 1 wherein determining whether a factor is a cause of poor correlation comprises determining whether gate widths are a cause of poor correlation.

16. The method of claim 15 wherein forming a first ring oscillator comprises forming a first ring oscillator from cells comprising transistors having a first width and wherein forming a second ring oscillator comprises forming a second ring oscillator from cells comprising transistors having a second width.

17. A method for identifying a cause of poor correlation between an integrated circuit model and measured integrated circuit performance, the method comprising:
   determining a first propagation delay for a first integrated circuit component;
   determining a second propagation delay for a second integrated circuit component; and
   comparing the first propagation delay to the second propagation delay to identify the cause of poor correlation between the integrated circuit model and the measured integrated circuit performance.

18. The method of claim 17 wherein determining a first propagation delay for a first integrated circuit component comprises determining a first propagation delay for an integrated circuit component that comprises transistors with a first gate length and wherein determining a second propagation delay for a second integrated circuit component comprises determining a second propagation delay for an integrated circuit component that comprises transistors with a second gate length.

19. The method of claim 17 wherein determining a first propagation delay for a first integrated circuit component comprises determining a first propagation delay for an integrated circuit component that comprises transistors with a first width and wherein determining a second propagation delay for a second integrated circuit component comprises determining a second propagation delay for an integrated circuit component that comprises transistors with a second width.

20. The method of claim 17 wherein determining a first propagation delay for a first integrated circuit component comprises determining a first propagation delay for a gate having a first input in a first state and wherein determining a second propagation delay for a second integrated circuit component comprises determining a second propagation delay for a gate having a first input in a second state.

21. The method of claim 17 wherein determining a first propagation delay for a first integrated circuit component comprises determining a first propagation delay for a gate having a first input in a static state and wherein determining a second propagation delay for a second integrated circuit component comprises determining a second propagation delay for a gate having a first input in a changing state.

22. The method of claim 17 wherein determining a first propagation delay for a first integrated circuit component comprises determining a first propagation delay for a gate without a load at the output of the gate and wherein determining a second propagation delay for a second integrated circuit component comprises determining a second propagation delay for a gate with a capacitive load at the output of the gate.

23. The method of claim 17 wherein determining a first propagation delay for a first integrated circuit component comprises determining a first propagation delay for a gate without a capacitive load that exhibits the Miller effect at the output of the gate and wherein determining a second propagation delay for a second integrated circuit component comprises determining a second propagation delay for a gate with a capacitive load that exhibits the Miller effect at the output of the gate.

* * * * *